United States Patent
Kim

(10) Patent No.: US 9,263,149 B2
(45) Date of Patent: Feb. 16, 2016

(54) SEMICONDUCTOR DEVICE WITH OTP MEMORY CELL

(71) Applicant: SK hynix Inc., Icheon-si, Gyeonggi-do (KR)

(72) Inventor: Tae Hoon Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 558 days.

(21) Appl. No.: 13/624,255

(22) Filed: Sep. 21, 2012

(65) Prior Publication Data

US 2013/0077377 A1    Mar. 28, 2013

(30) Foreign Application Priority Data

Sep. 23, 2011    (KR) .................. 10-2011-0096042

(51) Int. Cl.
     *G11C 5/06*      (2006.01)
     *G11C 17/08*      (2006.01)
     *G11C 17/16*      (2006.01)
     *G11C 17/00*      (2006.01)

(52) U.S. Cl.
     CPC ............... *G11C 17/08* (2013.01); *G11C 17/00* (2013.01); *G11C 17/16* (2013.01)

(58) Field of Classification Search
     CPC ......... G11C 17/08; G11C 17/00; G11C 17/16
     USPC .................................... 365/104, 103, 63
     See application file for complete search history.

(56) References Cited

U.S. PATENT DOCUMENTS

| | | | |
|---|---|---|---|
| 6,667,902 B2 | 12/2003 | Peng | |
| 2004/0037127 A1* | 2/2004 | Lindhorst et al. | 365/202 |
| 2007/0030719 A1* | 2/2007 | Hoefler et al. | 365/94 |
| 2012/0120707 A1* | 5/2012 | Kim | 365/104 |

* cited by examiner

*Primary Examiner* — Toan Le
(74) *Attorney, Agent, or Firm* — William Park & Associates Ltd.

(57) ABSTRACT

A semiconductor device includes a one-time programmable (OTP) memory cell includes a first MOS transistor having a gate coupled to a bit line, a first switching device, coupled to one side of a source/drain of the first MOS transistor, configured to provide a current path for a current supplied to the gate of the first MOS transistor, and a second switching device configured to provide a bias voltage at the other side of the source/drain of the first MOS transistor.

13 Claims, 6 Drawing Sheets

< Initial OTP cell >

< Initial OTP cell >

< Programmed OTP cell >

< Initial OTP cell >

< Programmed OTP cell >

< Program operation >

< Read operation >

SEMICONDUCTOR DEVICE WITH OTP MEMORY CELL

CROSS-REFERENCE(S) TO RELATED APPLICATIONS

The present application claims priority under 35 U.S.C. 119(a) to Korean Patent Application No. 10-2011-0096042, filed on Sep. 23, 2011, in the Korean Intellectual Property Office, which is incorporated herein by reference in its entirety.

BACKGROUND OF THE INVENTION

1. Field of the Invention

The present invention relates to a semiconductor device, and more particularly to a semiconductor memory device including one-time programmable (OTP) memory cells.

2. Description of the Related Art

A semiconductor memory device is a storage which stores data and reads the data when the data is needed. The semiconductor memory device is generally divided into two categories: a random access memory (RAM) and a read only memory (ROM). The ROM is a nonvolatile memory which can retain data even if power is off. The ROM includes a programmable read only memory (PROM), an erasable programmable read only memory (EPROM), an electrically erasable programmable read only memory (EEPROM), a flash memory device, etc. The RAM is a volatile memory which cannot retain data when a power is off. The RAM includes a dynamic random access memory (DRAM), a static random access memory (SRAM), etc. Aside from these memory devices, an innovative semiconductor memory device using nonvolatile materials instead of capacitors used in a DRAM has been developed. The innovative semiconductor memory device includes a ferroelectric random access memory (FRAM) using ferroelectric capacitors, or a magnetic random access memory (MRAM) using a tunneling magneto-resistive (TMR) layer.

One time programmable (OTP) cells can store data only once, like the Programmable ROM.

A memory block including OTP memory cells is typically used for either storing trimming information of an integrated circuit, security identification information, chip identification information, calibration data, or storing main memory block redundancy information. As systems including integrated circuits become more technologically sophisticated and/or operationally complex, a memory block including OTP memory cells requires a higher operation speed.

SUMMARY OF THE INVENTION

An embodiment of the present invention is directed to a memory device including one-time programmable (OTP) memory cells which can be accessed at high speed.

In accordance with an embodiment of the present invention, a semiconductor device including an OTP memory cell includes a first MOS transistor having a gate coupled to a bit line, a first switching device, coupled to one side of a source/drain of the first MOS transistor, configured to provide a current path for a current supplied to the gate of the first MOS transistor, and a second switching device configured to provide a bias voltage at the other side of the source/drain of the first MOS transistor.

In accordance with another embodiment of the present invention, a semiconductor device including OTP memory cells includes first and second MOS transistors, each having a gate coupled to a bit line, a third MOS transistor, having a gate coupled to a first word line and one side of a source/drain coupled to one side of a source/drain of the first MOS transistor, configured to provide a current path for a current supplied to a gate of the first MOS transistor, a fourth MOS transistor, having a gate coupled to a second word line and one side of a source/drain coupled to one side of a source/drain of the second MOS transistor, configured to provide a current path for a current supplied to a gate of the second MOS transistor, a fifth MOS transistor configured to provide a first bias voltage to the other side of source/drain of the first MOS transistor, and a sixth MOS transistor configured to provide a second bias voltage to an other side of source/drain of the second MOS transistor.

DESCRIPTION OF SPECIFIC EMBODIMENTS

Figure 1:
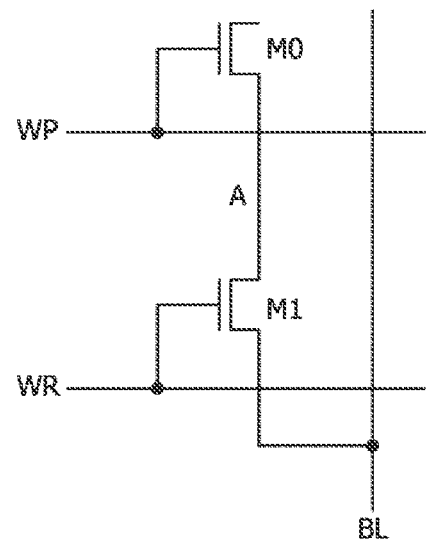
FIG. 1 is a circuit diagram showing a prior art one-time programmable (OTP) memory cell.

Example embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough, and will convey a scope of the present invention to those skilled in the art. Throughout this disclosure, like reference numerals refer to like parts throughout the various figures and embodiments of the present invention.

The present invention includes embodiments of one-time programmable (OTP) memory cells. Herein, the OTP memory cell can be electronically programmed with data only once; and even though power is no longer supplied to the memory cell, programmed data in the OTP memory cell is retained.

FIG. 1 is a circuit diagram showing a known OTP memory cell.

As shown, the OTP memory cell includes a first MOS transistor M0 and a second MOS transistor M1. A gate of the first MOS transistor M0 is coupled to a first word line WP, and a gate of the second MOS transistor M1 is coupled to a second word line WR. One side of source/drain of the first MOS transistor M0 is floated, and the other side is coupled to a resistance node A. Herein, the floated side of the first MOS transistor M0 does not have any effect on storing and reading data in the OTP memory cell. One side of source/drain of the second MOS transistor M1 is coupled to the resistance node A, and the other side is coupled to a bit line BL.

Generally, a gate of MOS transistor is formed by laminating conductive layers on an insulating layer. In a programming mode, an insulating layer included in the gate of first MOS transistor M0 is destroyed. The second MOS transistor M1 serves as a switching device configured to select the OTP memory cell.

Figure 2:
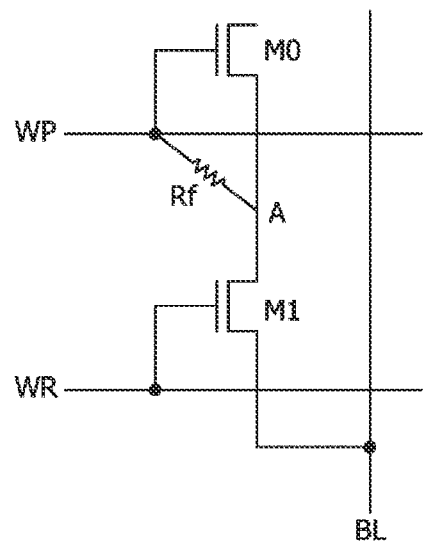
FIG. 2 is a circuit diagram depicting a state of the prior art OTP memory cell shown in FIG. 1 after the OTP memory cell is programmed.

FIG. 2 is a circuit diagram describing a state of the known OTP cell shown in FIG. 1 after the OTP memory cell is programmed. Referring to FIG. 2, a programming mode of the OTP memory cell shown in FIG. 1 is described. The bodies of the first and the second MOS transistors M0 and M1 may be coupled to ground voltages.

The first word line WP is supplied with a high level voltage VPP, and the second world line WR is coupled to a voltage having a lower level than the high level voltage VPP, e.g., a half level voltage (VPP/2). The bit line BL is coupled to ground voltage. Herein, the high level voltage VPP is a voltage having a sufficient level to destroy an insulating layer included in a gate pattern of first MOS transistor M0, where the high level voltage VPP is substantially received via the first word line WP. For example, if it is assumed that a power voltage is 1.2V, a high level voltage VPP might be 6V, i.e., higher level than 1.2V.

Since the gate of the second MOS transistor M1 is supplied to a first voltage (VPP/2), the gate is turned on, and then the resistance node A is coupled to ground voltage. The gate of first MOS transistor M0 is coupled to the high level voltage VPP. Due to difference of voltage levels supplied to the gate and the one side of source/drain of the first MOS transistor M0, the insulating layer of first MOS transistor M0 is destroyed, i.e., broken down. When the insulating layer is destroyed, a current path is created between the first word line WP and the resistance node A. There is a resistance Rf in the current path. In order to reliably destroy an insulating layer included in the gate pattern of first MOS transistor M0 during a programming mode, the insulating layer can be formed thinner than those of other transistors. Also, to increase programming reliability, the high level voltage VPP can have a higher voltage level than a predetermined voltage level where the predetermined voltage level can destroy the insulating layer included in the gate pattern of first MOS transistor M0.

In a read mode, the first word line WP is supplied with a power voltage VDD, and the second word line WR is coupled to the power voltage VDD. The bit line is precharged with a ground voltage the level. If the insulating layer included in the gate pattern of first MOS transistor M0 is destroyed (breakdown status), a voltage level of bit line BL rises. A sense amplifier (not shown) coupled to the bit line BL senses a voltage level of the bit line BL. The sense amplifier is configured to compare a reference voltage level with a voltage level of the bit line BL and recognize whether voltage level of the bit line BL has risen to the reference voltage level.

Otherwise, if the insulating layer included in the gate pattern of first MOS transistor M0 is not destroyed, the voltage level of bit line BL does not rise and therefore retains the precharged voltage level. Depending on whether the insulating layer of first MOS transistor M0 is destroyed, the sense amplifier coupled to the bit line BL can sense a voltage level supplied to the bit line BL, and determine which data '0' or '1' is stored in the OTP cell.

However, there are some problems in the OTP memory cell shown in FIG. 2.

First, a system may wait a long time for using data stored in the OTP memory cell. Access time of the OTP memory cell shown in FIGS. 1 and 2 is about 200 ns. If it is assumed that a system having an operation frequency of 100 MHz is embedded with the OTP memory cell, the system has to wait a long time for using data stored therein. To achieve a real-time read operation, the system additionally needs a buffer memory such as a SRAM or a register.

Second, when an insulating layer is broken down during a programming mode, there may be an irregular condition of breakdown in the OTP memory cell shown in FIGS. 1 and 2. When the OTP memory cell is programmed, the body of first MOS transistor M0 is coupled to ground voltage, one side of the first MOS transistor, for example, the source/drain is floated, and the other side is coupled to a ground voltage supplied to the resistance node A. Accordingly, it is highly possible that a breakdown portion of the insulating layer is located near the resistance node A. But, in some cases, the breakdown portion could be located in center area between source/drain. According to random location of the breakdown portion, the resistance Rf shown in FIG. 2 is changed. Thus, in a case when a system is embedded with the above described OTP memory cell, the system and the OTP memory cell should be designed for the maximum value of resistance Rf to achieve stable data access operation. Thus, the breakdown portion should be more consistently located in order to provide the maximum value of resistance Rf.

As described above, the OTP memory cell shown in FIG. 1 has several limits to reduce data access time. To overcome the above described problem, the present invention provides an OTP memory cell which can access data at high speed.

Figure 3:
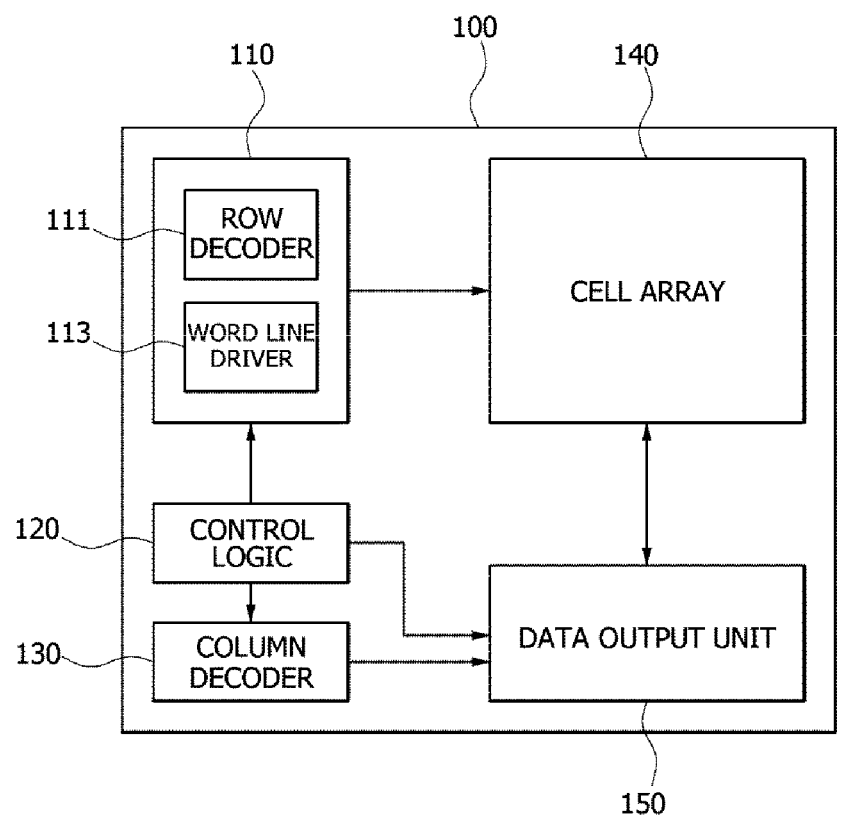
FIG. 3 is a block diagram showing a semiconductor memory device with OTP memory cells in accordance with an embodiment of the present invention.

FIG. 3 is a block diagram showing a semiconductor memory device with OTP memory cells in accordance with an embodiment of the present invention.

As shown, the semiconductor memory device 100 with OTP memory cells includes an address control block 110 having a row decoder 111 and a word line driver 113, a control logic 120, a column decoder 130, a cell array 140, and a data output block 150. In the address control block 110, the row decoder 111 is for decoding a row address, and the word line driver 113 is for controlling a word line selected by the decoding result of the row decoder 111. The control logic 120 is for controlling the address control block 110, the column decoder 130 and the data output block 150 in response to instructions inputted from external devices. The column decoder 130 is for decoding a column address. The data output block 150 is for outputting some signals, selected by the column address, among plural signals provided from the cell array 140. The cell array 140 includes a plurality of OTP memory cells.

The semiconductor device shown in FIG. 3 is either used as an independent device, or included in other memory device or semiconductor device as a component. For example, the semiconductor device could be used for either storing integrated circuit trimming information, security identification information, chip identification information, calibration data and etc., or storing main memory block redundancy information.

Figure 4:
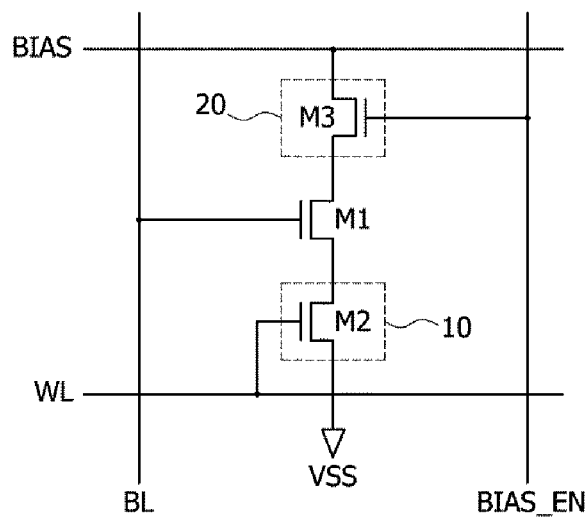
FIG. 4 is a circuit diagram showing an OTP memory cell in accordance with an embodiment of the present invention.

FIG. 4 is a circuit diagram showing an OTP memory cell in accordance with an embodiment of the present invention.

As shown, the OTP memory cell includes a first MOS transistor M1 having a gate coupled to a bit line BL, a first switching device 10, coupled to one side of a source/drain of the first MOS transistor M1, configured to provide a current path for a current supplied to the gate of the first MOS transistor M1, and a second switching device 20 configured to provide a bias voltage BIAS at the other side of source/drain of the first MOS transistor M1.

The first switching device 10 includes a second MOS transistor M2 having a gate coupled to a word line WL. The second switching device 20 includes a third MOS transistor M3 configured to provide the bias voltage BIAS to the first MOS transistor M1 if turned on in response to a bias enable signal BIAS_EN. Herein, the bias voltage BIAS is inputted through one side of source/drain of the third MOS transistor M3 and outputted through the other side of source/drain. One side of the source/drain of the second MOS transistor M2 is coupled to the one side of source/drain of the first MOS transistor M1, and the other side of the second MOS transistor is coupled to a ground voltage VSS.

Figure 5:
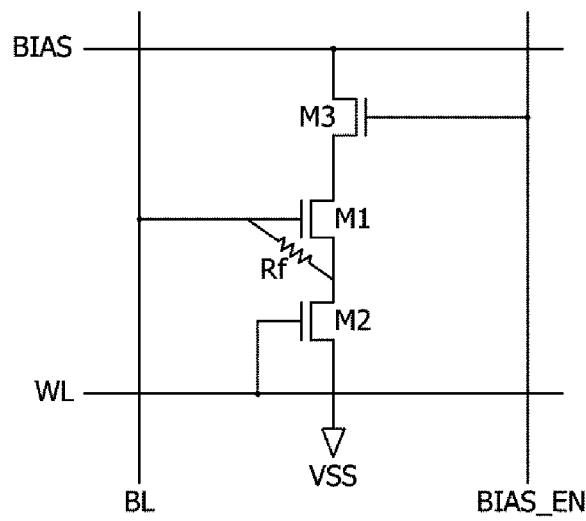
FIG. 5 is a circuit diagram describing a state of the OTP memory cell shown in FIG. 4 after the OTP memory cell shown is programmed.
Figure 6:
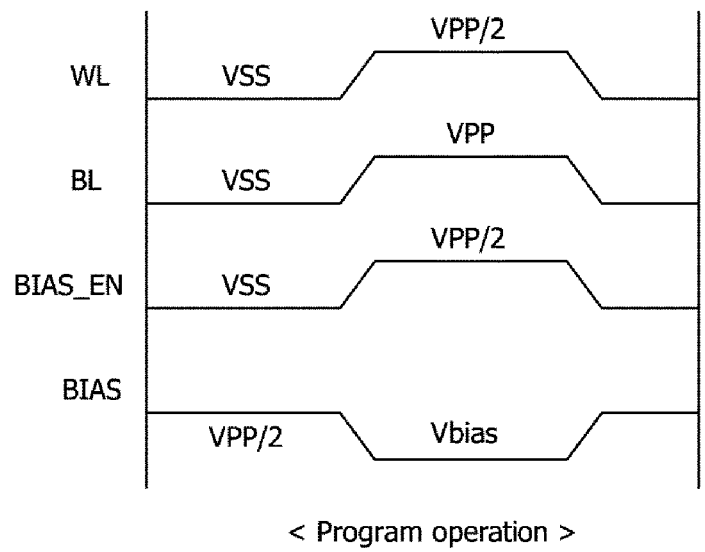
FIG. 6 is a timing diagram depicting an operation voltage supplied during a programming mode of the OTP memory cell shown in FIG. 4.

FIG. 5 is a circuit diagram showing a state of the OTP memory cell shown in FIG. 4 after the OTP memory cell is programmed. FIG. 6 is a timing diagram showing an operation voltage supplied during a programming mode of the OTP memory cell shown in FIG. 4. In the programming mode, according to data which would be stored in the OTP memory cell, a high level voltage may (or may not) be supplied to the bit line BL. The case when the high level voltage is supplied to the bit line BL is described.

Referring to FIGS. 5 and 6, in the programming mode, the bias voltage BIAS is supplied with a predetermined level Vbias such as 1 to 2 V. To break down a gate insulating layer of the first MOS transistor M1, the gate of the first MOS transistor M1 is supplied with a high level voltage VPP having a higher level than the bias voltage BIAS. The second and the third MOS transistors M2 and M3 are turned on by a turn-on voltage. The bit line BL is supplied with the high level voltage VPP. The word line WL and the bias enable signal BIAS_EN are supplied with the turn-on voltage. In this case, the gate of the first MOS transistor M1 is supplied with a high level voltage, and one side of source/drain is supplied with a ground voltage. Due to difference of voltage levels supplied between the gate and one side of source/drain, an insulating layer included in a gate pattern of the first MOS transistor M1 is broken down, i.e., destroyed, to thereby generate a resistance (referring to 'Rf' shown in FIG. 5). Herein, the turn-on voltage has a half level (VPP/2) of the high level voltage.

The gate pattern is generally formed in a stack structure of plural insulating layers and conductive layers. Herein, the breakdown target is a gate insulating layer, i.e., an insulating layer formed under the conductive layers. If both sides of the gate insulating layer of first MOS transistor M1 are supplied with the high level voltage VPP and the ground voltage VSS, i.e., the gate is supplied with the high level voltage VPP and one of source/drain is supplied with the ground voltage VSS, the gate insulating layer is broken down because of voltage gap. However, in the second and the third MOS transistors M2 and M3, there is no breakdown of gate insulating layers because each gate is supplied with the turn-on voltage having a lower level than the high level voltage VPP.

In the programming mode, hot carriers are generated in a channel area corresponding to the gate of the first MOS transistor M1 by the bias voltage BIAS and the high level voltage VPP. The high level voltage VPP is supplied to the gate of first MOS transistor M1, and the bias voltage BIAS having a predetermined level is supplied to one of source/drain of first MOS transistor M1 in order to generate hot carriers. For example, when a power voltage is about 1.2 V, a high level voltage VPP is in a range of about 6 V to about 8 V, and a bias voltage BIAS is in a range of about 1 V to about 2 V. The bias enable signal BIAS_EN is about 2.8 V.

Further, the high level voltage VPP has a sufficient level to break down the gate insulating layer of first MOS transistor M1. To obtain operation margin, the high level voltage VPP can have a higher level by 5% to 10% than a level sufficient to break down the gate insulating layer.

Figure 7:
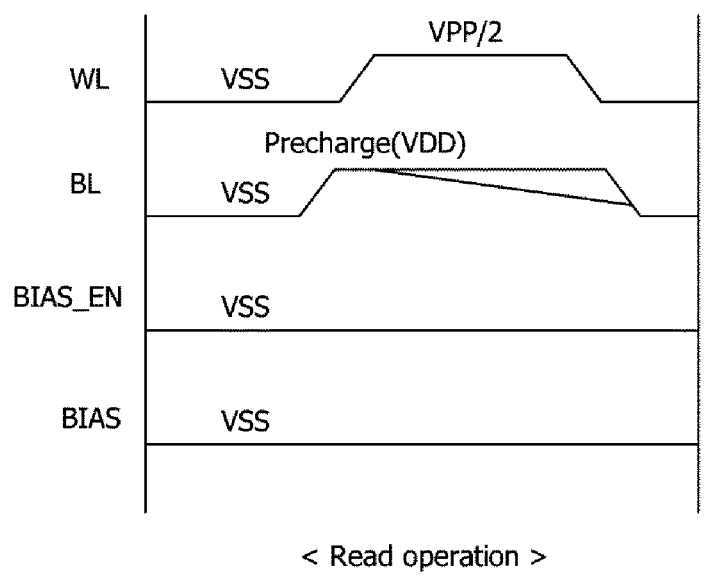
FIG. 7 is a timing diagram describing an operation voltage supplied during a read mode of the OTP memory cell shown in FIG. 4.

FIG. 7 is a timing diagram showing an operation voltage supplied during a read mode of the OTP memory cell shown in FIG. 4.

As shown, in a read mode, the bit line BL is precharged with a precharge voltage. The precharge voltage can have a power voltage level. After the precharge operation, the third MOS transistor M3 is turned off, and the second MOS transistor M2 is turned on. If the insulating layer included in the gate pattern of first MOS transistor M1 is destroyed (breakdown status) and a current flows through the gate pattern, a voltage level of bit line BL decreases. Otherwise, if the insulating layer included in the gate pattern of first MOS transistor M1 is not destroyed, the voltage level of bit line BL does not decrease. Depending on whether there is a current flowing through the gate pattern of first MOS transistor M1, the value of data stored in the OTP memory cell is determined. For example, if the current flows, the data is determined as a logic level '1'; if the current does not flow, the data is recognized as a logic level '0'.

In the OTP memory cell according to this embodiment, a bias voltage BIAS is inputted in the programming mode. When the high level voltage VPP is supplied to the gate of first MOS transistor M1, if the bias voltage BIAS is inputted to one side of source/drain of first MOS transistor M1, a current flows between the source/drain of first MOS transistor M1. Also, in a channel area of first MOS transistor M1, hot carriers are generated and electrons are injected into the gate. The injected electrons having high energy can generate holes having corresponding high energy in the gate. The generated holes move into the channel area, like a tunneling effect. At this time, the generated holes can aid the breakdown of gate insulating layer. According to these mechanisms, time for the breakdown of a gate insulating layer can be reduced. As a result, time for storing data in the OTP memory cell in the programming mode decreases.

Further, because of the generated holes, a breakdown portion of gate insulating layer can be located on the end of the channel area, i.e., close to one of the source/drain. Since the breakdown portion can be more regularly formed, a resistance Rf generated by the breakdown of gate insulating layer can be decreased up to the minimum value. If the resistances Rf in plural OTP memory cells can be set to a regular distribution, a time needed for changing a voltage level of the bit line BL is decreased more regularly in a read mode. Because the speed to change a voltage level of bit line BL is faster, data access time of the OTP memory cell is reduced. As compared with the OTP memory cell shown in FIG. 1, the data access time of OTP memory cell according to embodiments of the present invention is dramatically decreased, so additional buffer memories to overcome operation speed gaps may no longer be required. As a result, operation efficiency of a system which is embedded with the OTP memory cell according to an embodiment is increased.

Figure 8:
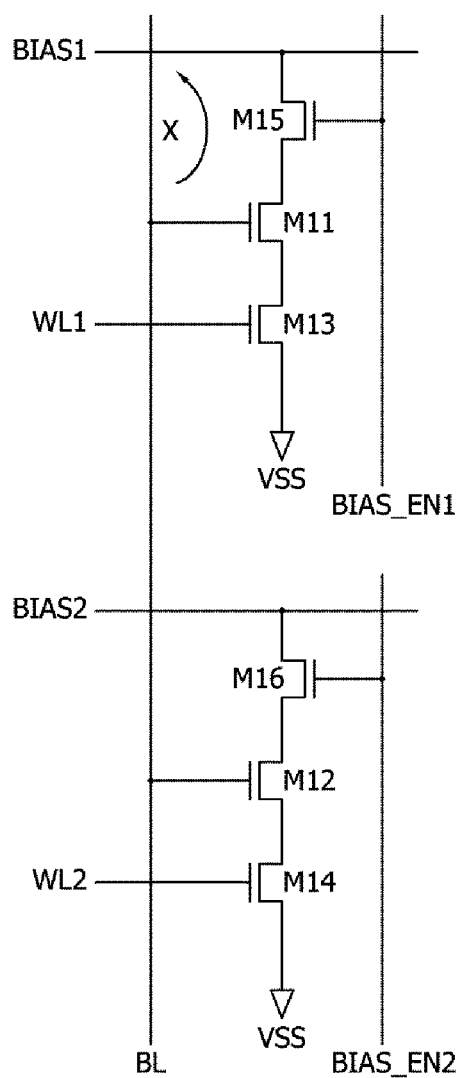
FIG. 8 is a circuit diagram showing an OTP memory block in accordance with another embodiment of the present invention.

FIG. 8 is a block diagram depicting an OTP memory block in accordance with another embodiment of the present invention. In FIG. 8, there are two OTP memory cells.

As shown, an OTP memory block includes: first and second MOS transistors M11 and M12, each having a gate coupled to the bit line BL; a third MOS transistor M13 having a gate coupled to a first word line WL1 and one side of source/drain coupled to one side of source/drain of the first MOS transistor M11 in order to provide a current path for a current supplied to the gate of the first MOS transistor M11; a fourth MOS transistor M14 having a gate coupled to a second word line WL2 and one side of a source/drain of MOS transistor M14 coupled to one side of the source/drain of the second MOS transistor M12 in order to provide a current path for a current supplied to the gate of the second MOS transistor M12; a fifth MOS transistor M15 configured to provide a first bias voltage BIAS1 to the other side of source/drain of the first MOS transistor M11; and a sixth MOS transistor M16 configured to provide a second bias voltage BIAS2 to the other side of source/drain of the second MOS transistor M12. Herein, the first and the second bias voltages BIAS1 and BIAS2 can have the same voltage level. In addition, the fifth and sixth MOS transistors M15 and M16 are respectively turned on in response to bias enable signals BIAS_EN1 and BIAS_EN2. Substantially, three MOS transistors M11, M13 and M15 form an OTP memory cell, and the three MOS transistors M12, M14 and M16 form another OTP memory cell. Since the operation of each OTP memory block is similar to that of OTP memory cell shown in FIG. 4, detailed description about the operation is omitted herein.

In the OTP memory block according to an embodiment, three MOS transistors constitute a single OTP memory cell. The OTP memory block may be formed of a plurality of OTP memory cells, each comprising three MOS transistors, and arranged in a row or column direction.

Moreover, it is assumed that a gate insulating layer of the first MOS transistor M11 is broken down so that a resistance is generated. In a programming mode where a high level voltage is inputted to break down a gate insulating layer of the second MOS transistor M12, if there is no fifth MOS transistor M15, current leaks from the first MOS transistor M11 into a node supplied with the first bias voltage BIAS1 because of a voltage supplied to the bit line BL, as shown by an 'X' path depicted in FIG. 8. As a result, if the OTP memory block does not include the fifth and the sixth MOS transistors M15 and M16, the OTP memory block may be arranged to include plural OTP memory cells configured in a row direction, but it may be that the plural OTP memory cells are not arranged in column direction.

However, in an embodiment of the present invention, each OTP memory cell includes three MOS transistors, and a bias voltage is selectively supplied to the OTP memory cell. Accordingly, a plurality of OTP memory cells can be arranged in a row direction, a column direction, or both directions like a matrix-type. Also, in a programming mode where a high level voltage is inputted to break down a gate insulating layer of second MOS transistor M12, if the fifth MOS transistor M15 is turned off, current is prevented from leaking through the 'X' path.

As described above, as compared with the OTP memory cell shown in FIG. 1, the OTP memory cell, using a bias voltage, according to embodiments of the present invention can retain regularly lower resistance generated by the breakdown of a gate insulating layer. Accordingly, a data read time can be decreased. Also, because of the bias voltage, the breakdown speed of a gate insulating layer increases so that a data write time can be decreased. Thus, data access time of the OTP memory cell according to the embodiments is dramatically reduced, as compared with that of the OTP memory cell shown in FIG. 1. Where various systems or other devices are embedded with the OTP memory cell according to embodiments, additional buffer memories for increasing a data access timing margin are no longer required.

In embodiments of the present invention, it is possible to readily implement one-time programmable (OTP) memory cells which can be accessed at high speed.

While the present invention has been described with respect to specific embodiments, it will be apparent to those skilled in the art that various changes and modifications may be made to the disclosed embodiments without departing from the spirit and scope of the invention as defined in the following claims.

What is claimed is:

1. A semiconductor device including a one-time programmable (OTP) memory cell, comprising:
   a first MOS transistor having a gate coupled to a bit line;
   a first switching device, coupled to one side of a source/drain of the first MOS transistor, configured to provide a current path for a current supplied to the gate of the first MOS transistor in response to a word line, wherein the other side of the first switching device is coupled to a ground voltage; and
   a second switching device configured to provide a bias voltage at the other side of the source/drain of the first MOS transistor.

2. The semiconductor device as recited in claim 1, wherein the second switching device includes a third MOS transistor configured to provide the bias voltage to the first MOS transistor if turned on in response to a bias enable signal, wherein the bias voltage is inputted through one side of a source/drain of the third MOS transistor and outputted through a source/drain on the other side of the third MOS transistor.

3. The semiconductor device as recited in claim 1, wherein the first switching device includes a second MOS transistor having a gate coupled to the word line.

4. The semiconductor device as recited in claim 3, wherein one side of a source/drain of the second MOS transistor is coupled to the one side of the source/drain of the first MOS transistor, and the other side of the second MOS transistor is coupled to the ground voltage.

5. The semiconductor device as recited in claim 4, wherein, in a programming mode, the bias voltage is supplied with a predetermined level, the gate of the first MOS transistor is supplied with a high level voltage having a higher level than the bias voltage to break down a gate insulating layer of the first MOS transistor, and the second and the third MOS transistors are turned on by a turn-on voltage.

6. The semiconductor device as recited in claim 5, wherein, in the programming mode, hot carriers are generated in a channel area corresponding to the gate of the first MOS transistor by the bias voltage and the high level voltage.

7. The semiconductor device as recited in claim 4, wherein the turn-on voltage is half the high voltage level.

8. The semiconductor device as recited in claim 4, wherein, in a read mode, the third MOS transistor is turned off, the second MOS transistor is turned on, and data is determined depending on whether there is a current flowing from a gate pattern of the first MOS transistor to the bit line.

9. A one-time programmable (OTP) memory cell comprising a first MOS transistor configured to receive a bias voltage at a source/drain of the first MOS transistor, and in a programming mode the first MOS transistor is supplied with a high level voltage having a higher level than the bias voltage to break down a gate insulating layer of the first MOS transistor.

10. The OTP memory cell of claim 9, wherein a gate of the first MOS transistor is coupled to a bit line, and the OTP memory cell further comprises:
   a first switching device, coupled to a first side of the source/drain of the first MOS transistor, configured to provide a current path for a current supplied to the gate of the first MOS transistor; and
   a second switching device configured to provide the bias voltage at a source/drain of a second side of the first MOS transistor.

11. The OTP memory cell of claim 10, wherein the second switching device includes a third MOS transistor configured to provide the bias voltage to the first MOS transistor if turned on in response to a bias enable signal, wherein the bias voltage is inputted through a source/drain on a first side of the third MOS transistor and outputted through a source/drain on a second side of the third MOS transistor.

12. The OTP memory cell of claim 11, wherein, in a read mode, the third MOS transistor is turned off, the second MOS transistor is turned on and data is determined depending on a whether there is a current flowing from a gate pattern of the first MOS transistor to the bit line.

13. The OTP memory cell of claim 10, wherein the first switching device includes a second MOS transistor having a gate coupled to a word line.

* * * * *